United States Patent [19]

Heuber et al.

[11] 4,280,198
[45] Jul. 21, 1981

[54] METHOD AND CIRCUIT ARRANGEMENT FOR CONTROLLING AN INTEGRATED SEMICONDUCTOR MEMORY

[75] Inventors: Klaus Heuber, Boeblingen; Siegfried K. Wiedmann, Stuttgart, both of Fed. Rep. of Germany

[73] Assignee: International Business Machines Corporation, Armonk, N.Y.

[21] Appl. No.: 101,366

[22] Filed: Dec. 7, 1979

[30] Foreign Application Priority Data

Dec. 22, 1978 [DE]  Fed. Rep. of Germany ....... 2855866

[51] Int. Cl.³ ............................................. G11C 11/40
[52] U.S. Cl. .................................. 365/203; 365/154; 307/459; 307/238.5
[58] Field of Search ....................... 365/154, 174, 203; 307/238

[56] References Cited

U.S. PATENT DOCUMENTS

| | | | |
|---|---|---|---|
| 3,540,010 | 11/1970 | Heightley et al. | 365/154 |
| 3,736,477 | 5/1973 | Berger et al. | 317/235 |
| 3,736,574 | 5/1973 | Gersbach | 365/174 |
| 3,786,442 | 1/1974 | Alexander et al. | 307/238 |
| 3,789,243 | 1/1974 | Donofrio et al. | 307/238 |
| 3,816,758 | 6/1974 | Bergen et al. | 307/214 |
| 4,021,786 | 5/1977 | Peterson | 365/174 |
| 4,032,902 | 6/1977 | Herndon | 357/44 |
| 4,090,255 | 5/1978 | Berger et al. | 365/154 |
| 4,112,511 | 9/1978 | Heald | 365/188 |
| 4,122,542 | 10/1978 | Camerik et al. | 365/156 |
| 4,122,548 | 10/1978 | Heuber et al. | 365/203 |

OTHER PUBLICATIONS

"MTL Storage Cell" by S. K. Weidmann, *IBM Tech. Dis. Bul.* vol. 21, No. 1, Jun. 1978 pp. 231–232.
"Bipolar Dynamic Memory Cell" by H. H. Henn, *IEEE Journal of Solid State Circuits*, vol. SC-6, No. 5 Oct. 1971, pp. 297–300.
"Merged-Transistor Logic (MTL)-A Low Cost Bipolar Logic Concept", *IEEE Journal of Solid State Circuits*, vol. SC-7 No. 5, Oct. 1972, pp. 340–346.
"Current Steering Simplifies & Shrinks I K Bipolar RAM" by J. E. Gersbach, *Electronics*, May 2, 1974, pp. 110–114.
"Restore Circuitry for Bit/Sense System" by S. K. Weidman, IBM Tech. Dis. Bul., vol. 13, No. 6, 1970 pp. 1705–1706.
"A Fast Access I-K-Bit RAM for Cache-Memory Systems" *IEEE Journal of Solid-State Circuits*, vol. SC-13 No. 5, Oct. 1978, pp. 656–663.

*Primary Examiner*—Terrell W. Fears
*Attorney, Agent, or Firm*—John A. Jordan

[57] ABSTRACT

In integrated semiconductor memory cell arrangements, particularly integrated semiconductor memory cell arrangements using merged transistor logic configurations, line capacitances are discharged before accessing to reduce access time and power consumption. Individual bit line transistor switching means are coupled to each bit line to provide a discharge path for the line capacitances associated therewith. Common transistor switching means are coupled to each individual bit line transistor switching means to commonly discharge the individual discharge currents received from each individual bit line transistor switching means. Individual word line transistor switching means are also connected to respective word lines to distribute the current passing through the common transistor switching means to the respective word lines. The discharge circuit arrangement permits minimum-area bit line and word line transistor switching means.

8 Claims, 3 Drawing Figures

4,280,198

METHOD AND CIRCUIT ARRANGEMENT FOR CONTROLLING AN INTEGRATED SEMICONDUCTOR MEMORY

DESCRIPTION

BACKGROUND OF THE INVENTION

1. Field of the Invention

The present invention relates to a method of controlling an integrated semiconductor memory device and circuit arrangement for carrying out same and, more particularly, to a method of controlling memory cells designed and arranged in accordance with merged transistor logic (MTL) techniques.

2. Description of the Prior Art

In German Pat. No. 25 11 518, methods and circuit arrangements are described for controlling an integrated semiconductor memory, the memory cells of which consist of flipflops with bipolar transistors and of Schottky diodes as read/write coupling elements and which, as load elements, use highly ohmic resistors or transistors connected as current sources. The write/read cycles of such arrangements are executed in several phases and are selected by level changes on word lines and bit lines which, for increasing the writing speed and the reading speed as well as for reducing the power dissipation, execute the discharge of the bit lines via the conductive memory cell transistors. The bit lines are discharged to ground via the conductive memory cell transistors, and during the reading phase of the memory the bit lines are re-stored only slightly so that the re-stored current flowing through the memory cell is very low.

In the field of logic circuits and memory techniques using bipolar transistors there has been substantial developments in recent years producing great interest in the industry, particularly those developments defined in the literature as MTL (merged transistor logic) or $I^2L$ (integrated injection logic). For typical examples of such logic circuit and memory designs reference is made to the IEEE Journal of Solid-State Circuits, Vol. SC/7, No. 5, October 1972, pp. 340ff and 346ff and U.S. Pat..Nos. 3,736,477 and 3,816,758. These designs, using bipolar transistors, are characterized by short switching times and are suitable for the layout of extremely highly integrated memories and logic arrays.

For an example of a further memory cell, reference is made to German Offenlegungsschrift No. 2,307,739. This memory cell is composed of two logic circuits wherein the collector of the inverting transistor of the one circuit is respectively coupled to the base of the inverting transistor of the other circuit. The two transistors are operated inversely and form the actual flipflop transistors. As a load element for both flipflop transistors the complementary transistor, connected via a separated line of each basic circuit, is used via the injection of the minority charge carriers, i.e. the current supply is effected. For addressing, i.e. for writing-in and reading-out of the memory cell, the base of each flipflop transistor is additionally connected to the emitter of the associated additional, equally complementary addressing transistor whose collector is applied to the associated bit line and whose base is applied to the address line.

German Offenlegungsschrift No. 2,612,666 discloses, with the use of an additional transistor, a highly integrated, inverting logic circuit with a zone sequence forming an inverting transistor. The inverting transistor is controlled (via an injection zone adjacent to the base-emitter junction) through the injection of load carriers with supply voltage, and at the base, said circuit is characterized in that connected to the injection zone a sense circuit is provided by way of which the conductive state of the inverting transistor is sensed on the basis of the current pre-injected into the injection area with the transistor being conductive.

Memories comprising cells showing an MTL-type structure require, in the selection of a cell, the re-charging of bit data and/or control line capacitances. The voltage swing of the bit lines corresponds approximately to the voltage swing of the selected word line. As already described in German Pat. No. 25 11 518, the capacitive discharge currents are discharged to ground via the memory cells of the selected word line and via the word line driver. However, with a high number of memory cells within a matrix this has the disadvantage that the surface area required for the driver circuit, the electric power dissipation for each driver, and delay time in the selection of the word line are, impractically, too high.

SUMMARY OF THE INVENTION

It is, therefore, an object of the present invention to provide an improved method for controlling a semiconductor memory.

It is a further object of the present invention to provide an arrangement for controlling memory cells of bipolar transistors and MTL-structure.

It is yet a further object of the present invention to provide a method and apparatus for controlling memory cells of bipolar transistors and MTL-structure which, with a decrease of the access time, considerably reduce the power consumption and avoid peak current on the supply lines and at the supply line source, and also to provide a particular circuit arrangement for carrying out this method.

The advantages of the proposed apparatus and method of the present invention arise from the fact that with a very short access/cycle time (in the nanosecond range) and with a very small power dissipation (in the milliwatt range), the DC-ground current is much lower for an unselected, highly integrated MTL memory chip than the capacitive peak current flowing through the discharge switch. If the peak current does not flow through the voltage supply sources but is instead used (as in the present mode of operation) for directly reloading the bit line capacitances, no interference voltage problems on the supply voltages are caused thereby.

The proposed circuit with the word line and bit line switches has another considerable advantage. If the discharge current of the bit line capacitances is connected to ground, the same voltage has to be applied from the reference voltage source to the word lines. If the current is applied as a DC-current there is a disadvantageously high power dissipation for the memory chip. If the current is taken from the word line capacitances themselves an increased voltage swing is necessary for the selected word line since through the capacitive coupling through the memory cells the non-selected word lines, too, execute a voltage swing, if only a reduced one. Additional increased word line capacitances reduce the problem but generate additional delay times in the word line selection. To prevent this, the non-selected word lines are kept at a constant potential by means of a circuit arrangement when a bit line is selected, with the bit line capacities having been previously discharged. The circuit can operate without low-ohmic reference source, without increase of the word line capacitances, and without increase of the voltage swing on the word lines. Thus, the electric power dissipation is reduced considerably. For the suggested operation of the circuit, the minimum allowable voltage swing for the selected word line is that which is required to sufficiently decouple the memory cells which are connected to a bit line. The minimum voltage swing depends on the number of memory cells and on their input characteristics.

The foregoing and other objects, features and advantages of the invention will be apparent from the following more particular description of a preferred embodiment of the invention, as illustrated in the accompanying drawings.

DESCRIPTION OF THE PREFERRED EMBODIMENTS

Figure 1:
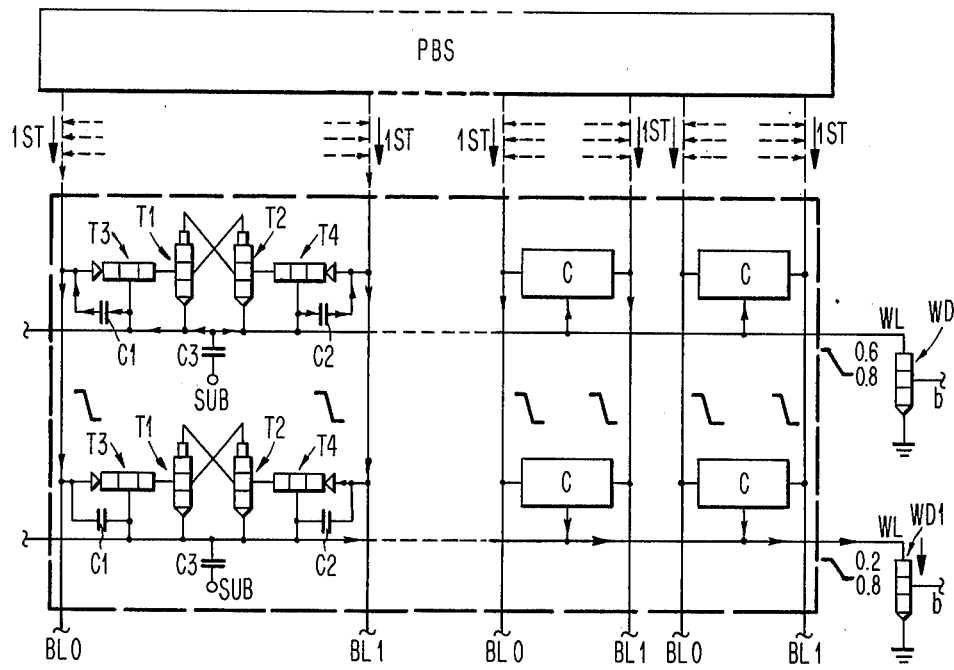
FIG. 1 shows an equivalent circuit diagram for the coupling from the selected word line to the non-selected word-line, the bit lines, and the capacitive coupling from the bit lines to the non-selected word line within a highly integrated memory with memory cells in MTL-structure.

FIG. 1 shows, within a matrix, MTL-memory cells C which are within the points of intersection of word lines WL and bit line pairs, BL1 and BL0. To the bit lines the peripheral bit circuits PBS are connected which supply the standby current IST. Word lines WL are connected to word line drivers WD whose base b is addressed by a word decoder, not shown. The MTL cells themselves comprise, in this example of two cross-coupled transistors T1 and T2, the upper small quadrangle being called the topcollector, and the lower small triangle of the inverse NPN-transistors being called subemitter. The bases of the two transistors T1 and T2 are each connected to the topcollector, i.e. transistors T1 and T2 are cross-coupled. The subemitters of the two transistors T1 and T2 are connected to word line WL to which the base electrodes of the two PNP-coupling transistors T3 and T4 are also connected. The coupling transistors are provided between a bit line BL1 and BL0 and the base of one of the two transistors T1 and T2.

In the two detailed cells of FIG. 1, the stray capacities C1 and C2 in each cell are shown coupled between bit lines BL1 and BL0 and word line WL, and a stray capacity C3 is shown between substrate SUB and word line WL. These capacities C1, C2 and C3 have to be re-stored in the selection of a memory cell C which requires the selection of a word line WL. These capacitive discharge currents can now be connected to ground via memory cells C of the selected word line, and via the associated word line driver. Each of the word line drivers WD provided would, therefore, have to exist for the entire discharge current. The discharge currents are represented in FIG. 1 by the arrow points in the conductive paths, the arrow points in the upper area representing the discharge currents of other memory cells not shown, and those on the word line representing the discharge current from other memory cells C connected to the same word line. In FIG. 1 it is assumed that the lower word line WL is to be selected, and that the upper one is not selected. It should also be noted that, apart from the lowermost word line, none of the shown or not shown word lines in the memory cell array is selected. For selecting the lowermost word line WL, word line driver WD1 is switched on by a signal on b from a decoder that is not shown. This switching-on causes a voltage swing on the associated word line WL (as shown) from the upper level to the lower one. On bit lines BL1 and BL0, the voltage follows the voltage swing on word line WL via the coupling diode from transistors T3 or T4, respectively, of the selected cells. Thus, the capacitive currents discharge the non-selected word lines WL by a predetermined swing. The difference swing between selected word line and non-selected word lines WL causes the decoupling of memory cells C at the non-selected word lines.

After this process, reading or writing can be executed as known. A typical reading and writing operation will be described as follows.

First, the respective word line WL is selected via bit decoders (not shown) and associated word line driver WD. It is now assumed that a binary zero is to be written. For that purpose, the writing current from the peripheral circuits is applied to the cell injector via the associated bit line BL0. The cell NPN transistor on the one side of bit line BL0 is thereby switched on, and the other cell transistor is switched off. The zero is thus written in. The writing of a binary one is performed analogously.

The reading process will now be described. It is assumed that a stored zero is to be read out and that the cell transistor T1, connected to bit line BL0 via transistor T3, is on and that the other cell transistor T2 is off. The respective word line WL is selected by a driver WD, and the read currents are impressed via bit lines BL0 and BL1; they are both of the same value. Subsequently, the selected memory cell produces a read signal, with the read signal on bit line BL0 being more positive than on bit line BL1. Thus, a zero has been read. For closing the read or write process, the read or write currents are switched off, and the voltage levels on word lines WL and on bit lines BL0 and BL1 are returned again to the high standby potential.

Figure 2:
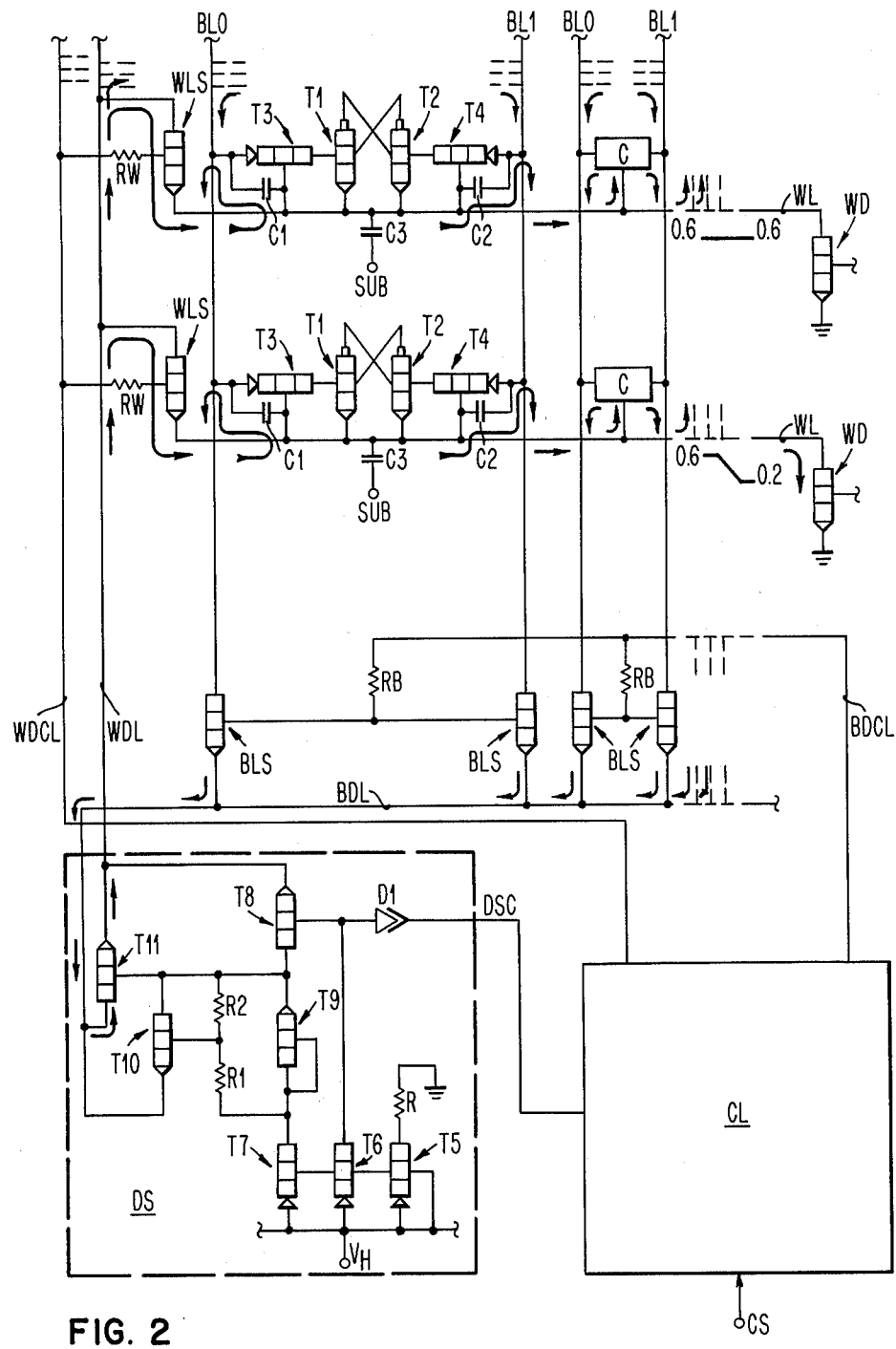
FIG. 2 shows an MTL-memory with low power dissipation, a discharge circuit and a control logic, the current being shown in the discharge phase.

In order to describe a fast discharge of the word and bit line capacitances represented by capacitances C1, C2 and C3 without the appearance of high peak currents through word line drivers WD, reference is made to FIG. 2. In this regard, FIG. 2 represents a highly advantageous circuit and structure for discharging an MTL semiconductor memory, in accordance with the principles of the present invention.

FIG. 2 shows an MTL memory array using the cell structure according to FIG. 1. Memory cells C are again arranged within the intersection of bit line pairs BL0 and BL1 and word lines WL. Word lines WL are again connected on the right side of the memory arrangement to word drivers WD which drivers receive their control signal from decoding circuits not shown. On the left side, each word line WL is connected to a word line switch WLS, or more precisely to its emitter. The base of a word line switch WLS is connected, via a resistor RW, to a word line WDCL, in turn, is connected to control logic CL which is controlled by the chip select signal CS, and which for the entire memory chip shown supplies the necessary time and control pulses. The collectors of word line switches WLS are connected to a word discharge line WDL which in turn is connected to a discharge circuit DS controlled by control logic CL. On the bit side of the memory arrangement, each bit line BL0 and BL1 contains bit line switches BLS which are controlled in pairs via resistors RB by a common bit discharge control line BDCL, which in turn is connected to control logic CL. The emitters of the bit line switches BLS are connected to a bit discharge line BDL which, in turn, is connected to the input of discharge circuit DS. Before describing the discharge operation in the circuit according to FIG. 2, the operation of the discharge circuit DS will first be described.

Discharge circuit DS consists of PNP-transistors T5 and T7 acting as current sources, whose input electrodes and base electrodes are connected to a voltage supply line VH. The output electrode of transistor T5 is connected to ground via a resistor R and the output electrode of transistor T6 is connected to the base of a control transistor T8. The output electrode of transistor T7 is connected to the input electrode of transistor T9 which acts to provide a clamp reference voltage, via a voltage divider R1 and R2, to the actual clamp transistor T10 for switching transistor T11. It should also be mentioned that the base of control transistor T8 is connected, via a Schottky diode D1, to the control logic CL, and that the emitter of control transistor T8 is connected to the emitter of switching transistor T11, and to the word discharge line WDL. The bit discharge line BDL is connected to the collector of switching transistor T11. The base of switching transistor T11 is connected to the emitter of transistor T9, and to the collector of control transistor T8.

In the following, the discharge currents within the storage arrangement according to FIG. 2 will be described. First, it is assumed that the difference voltage of the injectors of the memory cell is at 0.4 V between selected and non-selected memory cell. Generally, the bit line capacitances are discharged via bit line switches BLS, via word line switches WLS, and via discharge circuit DS. The current path represented by the arrows in FIG. 2 will now be explained.

Controlled by chip select signal CS and control logic CL, bit line transistors BLS are activated, i.e. switched on, via bit discharge control line BDCL, and word line transistors WLS are activated via word line discharge control line WDCL. Control logic CL furthermore applies a control pulse to discharge circuit DS. The bit line capacitances are thus discharged. Then, the word and bit selection is switched on. The discharge of the bit line capacitances has the effect that through the capacitances represented by capacitances C1 and C2 of the memory cells there flows a current in bit lines BL0 and BL1. This current flows via bit line switches BLS to the common bit discharge line BDL, and then, via switching transistor T11 in discharge circuit DS, to word discharge line WDL. The current then flows via word line switches WLS to word lines WL, and then the currents are distributed over capacitances C1 and C2 represented in the memory cells. The cycle is thus closed. As pointed out already, the word and bit line selection is subsequently switched on to select a predetermined word line WL within the memory matrix. Prior to the activation of the respective word line driver WD after the selection through the decoder circuits (not shown), the discharge of the bit line capacitances have to be terminated so that the word and bit line switches WLS and BLS thus have to be switched off prior to the switching on of the predetermined word line driver WD.

As shown in FIG. 2, bit line capacitances are discharged through the bit line switching transistors BLS, through one single common discharge switching transistor T11 with collector-emitter voltage stabilization, and then through the additional word line switches WLS associated with each word line WL. Bit lines switches BLS carry only that amount of the capacitive peak current which originates from a bit line BL0 or BL1, i.e. in a memory with N bit line pairs and N word lines they carry only 1 divided by 2N of the entire peak current. Therefore, with respect to their size these transistors can be designed as minimum area transistors. Only switching transistors T11 in discharge circuit DS has to be designed for the entire peak current. The addressing power for the discharge transistor T11 has to be so high that it suffices for driving the entire maximum current. For bit line switches BLS and word line switches WLS, only that driver capacity has to be made available which corresponds to its part of the current.

In an MTL memory chip of standard design with, e.g. 50 nanoseconds access time and 50 to 100 milliwatt power dissipation, in the non-selected state the DC-GND current is much lower than the capacitive peak current flowing through discharge transistor T11. If this peak current does not flow through the voltage supply sources but is used for directly restoring the bit line capacitances as in the present case, there are no noise problems in the supply voltages. In the selection of a word line with a preceding discharge of the bit line capacitances, the non-selected word lines WL are kept constant in potential by means of the above described discharge system and the shown discharge circuit. The circuit may operate without a low-ohmic reference source, without increase of the word line capacitances, and without an increase of the voltage swing for the selected word lines. Consequently, the electric power dissipation is kept low. In the embodied selection system the minimum voltage level for the selected word line is that required for satisfactorily decoupling the cells connected to a bit line BL0 and BL1. The minimum voltage swing depends on the number of cells in the memory and their input characteristic.

Figure 3:
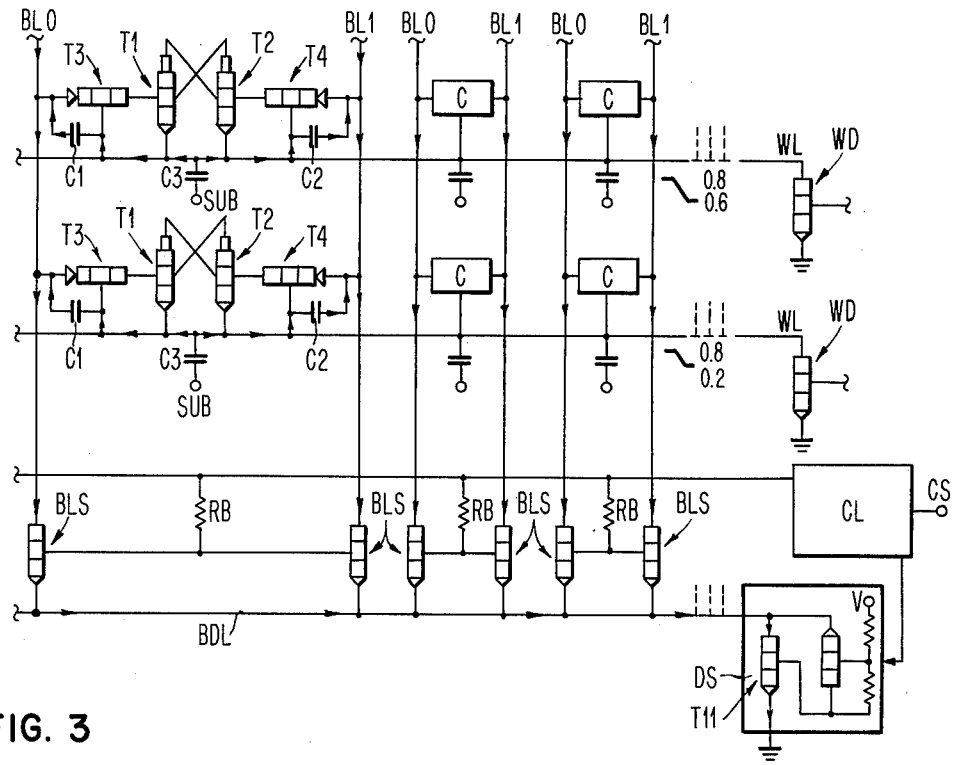
FIG. 3 shows another embodiment of a highly integrated memory with a discharge circuit.

FIG. 3 shows another embodiment with a discharge circuit DS for all bit lines. The difference compared with FIG. 2, however, resides in the fact that the discharge of the bit line capacitances is not effected via the word line switches and word lines, but directly through discharge circuit DS to ground GND. For better understanding, the same structure of the memory cells is assumed as in FIGS. 1 and 2. As pointed out above, it is equally possible to use other MTL memory cells, as e.g., the SGPL memory cell.

In FIG. 3, the discharge process for the bit line capacitances is again executed in the selection of a word line WL via word line driver WD which is controlled by decoder circuits, now shown. The difference voltage for the selection between selected and non-selected word line amounts to approximately 0.4 V. Through capacitive coupling, the voltage of the non-selected word line will execute approximately $\frac{1}{3}$ of the word line voltage swing of the selected word line. The word line voltage swing of the selected word line is in this embodiment approximately 0.6 V. The standby potentials are: GND=0 V, the voltage on the word lines is 0.8 V and the voltages on the bit lines are 1.4 V. When a word line of the memory matrix has been selected, there appear the following potentials. Selected word line 0.2 V, non-selected word line 0.6 V, bit lines 1.0 and the injector voltage of the selected cell is +0.8 V, and of the non-selected cell +0.4 V.

Here, too, the bit line capacitances have to be discharged prior to the selection of a word line WL. Energized by an applied chip selection signal CS, control logic CL applies a signal to discharge circuit DS, and to bit discharge control line BDCL. Thus, there is a current flow from the substrate of the memory matrix via capacitances C3, via word lines WL, via capacitances C1 and C2 to bit lines BL1 and BL0, then via bit line switches BLS to the common bit discharge line BDL via discharge switch T11 of discharge circuit DS to ground GND. Due to the capacitive coupling, the voltages on the non-selected word lines WL are decreased by 0.2 V in the present example, whereas after a completed discharge the voltage of the word line selected by the word line driver WD is decreased by 0.6 V.

FIG. 3 gives a simplified representation of discharge circuit DS although here, too, the corresponding circuit of FIG. 2 may be used. The advantage of the circuit in accordance with FIG. 3, compared with that of FIG. 2, resides in the fact that no word line switches (with associated control line and discharge line) are required. The transistors of the word line drivers and the bit line switches, however, are to be designed for currents higher than those of FIG. 2. If a re-storing of the word line capacitance C3 is not required during the re-storing of bit line capacitances C1 and C2, the re-store current required for that purpose can be fed from a reference source (not shown) into the word lines. The non-selected word lines are not re-stored, and for the selection only the minimum voltage swing of the word line is required.

While the invention has been particularly shown and described with reference to a preferred embodiment thereof, it will be understood by those skilled in the art that numerous changes in form and detail may be made therein without departing from the spirit and scope of the invention.

We claim:

1. In a method of controlling a semiconductor memory of arrayed memory cells including arrayed memory cells arranged in merged transistor logic with said cells coupled at intersections of word and bit lines and selected via word line drivers and decoders, the improvement residing in discharging the line capacitances for reducing the access time and power consumption of said memory cells, comprising the steps of,
 discharging said line capacitance before cell selection by causing said line capacitances to discharge through line control means coupled to respective ones of the bit lines or word lines associated with each cell and then through a common control means common to all line control means.

2. The method of claim 1 wherein at least a portion of the current discharged through said common control means is discharged through line control means coupled to the said bit lines associated with each cell.

3. The method of claim 1 wherein the current discharged through said common control means is discharged to a reference potential.

4. In memory arrays of semiconductor memory cells including arrays of semiconductor memory cells arranged in merged transistor logic, said cells coupled at the intersections of word lines and bit lines and selected via word line drivers and decoders, the improvement residing in discharging line capacitances before accessing for reducing the access time and power consumption of said memory cells, comprising;
 individual control means respectively coupled to each bit line for discharging line capacitances;
 common control means coupled to each individual control means for discharging in common all of the said line capacitances discharged through said individual control means; and
 discharge control means coupled to the said individual control means and said common control means to concurrently apply discharge control signals thereto to cause said line capacitances to discharge before each cell selection operation.

5. In the memory arrays as set forth in claim 4 including further control means coupled between said common control means and respective ones of said word lines to cause at least a portion of the discharge current passing through said common control means to be directed to respective ones of said word lines for distribution thereover.

6. In the memory arrays as set forth in claim 5 wherein said discharge control means coupled to the said individual control means and common control means comprises control logic means coupled to receive cell selection signals and initiate said discharge control signals prior to initiating cell selection signals.

7. In the memory arrays as set forth in claim 6 wherein said common control means includes a common switching transistor with collector-emitter voltage stabilization.

8. In the memory arrays as set forth in claim 6 wherein the individual control means and the further control means each comprise transistors which are minimum-area transistors.

* * * * *